US010480720B2

(12) United States Patent
Price et al.

(10) Patent No.: US 10,480,720 B2
(45) Date of Patent: Nov. 19, 2019

(54) ACTIVE ILLUMINATION SOURCE AND PCB COMPONENTS HAVING MOUNTINGS FOR REDUCED Z-HEIGHT AND IMPROVED THERMAL CONDUCTIVITY

(71) Applicant: MICROSOFT TECHNOLOGY LICENSING, LLC, Redmond, WA (US)

(72) Inventors: Raymond Kirk Price, Redmond, WA (US); Christopher John McMillan, Woodinville, WA (US); Rachel Leigh Peters, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/679,547

(22) Filed: Aug. 17, 2017

(65) Prior Publication Data
US 2019/0056067 A1    Feb. 21, 2019

(51) Int. Cl.
| F21K 9/20 | (2016.01) |
| H01L 33/48 | (2010.01) |
| H01L 33/64 | (2010.01) |
| F21V 29/70 | (2015.01) |
| H04N 5/225 | (2006.01) |

(Continued)

(52) U.S. Cl.
CPC ............... *F21K 9/20* (2016.08); *F21V 29/70* (2015.01); *H01L 33/486* (2013.01); *H01L 33/62* (2013.01); *H01L 33/64* (2013.01); *H04N 5/2256* (2013.01); *H04N 5/2257* (2013.01); *H01L 33/54* (2013.01)

(58) Field of Classification Search
CPC ......... H01L 33/64; H01L 33/486; F21K 9/20; F21V 29/70
See application file for complete search history.

(56) References Cited

U.S. PATENT DOCUMENTS 5,871,271 A * 2/1999 Chien .................... A42B 3/044
362/103
8,174,832 B2    5/2012 Yu et al.
(Continued)

FOREIGN PATENT DOCUMENTS

CN         104282676 A    1/2015

OTHER PUBLICATIONS

Langer, et al., "Advanced Thermal Management Solutions on PCBs for High Power Applications", In Proceedings of IPC APEX EXPO, Mar. 25, 2014, pp. 1-15.

(Continued)

*Primary Examiner* — Peniel M Gumedzoe
(74) *Attorney, Agent, or Firm* — Workman Nydegger

(57) ABSTRACT

PCBs, PCB components and PCB assemblies are provided with mounting configurations and structures for reducing Z height dimensions of the PCB assemblies and, in some instances, for improving thermal conductivity of the PCB components and assemblies. The active illumination device/source or other PCB components (e.g., camera modules and LED packages) are affixed to a mounting substrate that has a top surface that is physically and electrically mounted to a bottom surface of a PCB, with at least a portion of the active illumination device/source being concurrently positioned within one or more holes in the PCB. A thermal interface in contact with at least the mounting substrate can also be used for dissipating heat from the PCB components and PCB.

14 Claims, 8 Drawing Sheets

(51) Int. Cl.
*H01L 33/62* (2010.01)
*H01L 33/54* (2010.01)

(56) References Cited

U.S. PATENT DOCUMENTS

| | | |
|---|---|---|
| 2004/0264195 A1 | 12/2004 | Chang et al. |
| 2009/0026485 A1* | 1/2009 | Urano ............... H01L 33/483 257/99 |
| 2010/0149806 A1 | 6/2010 | Yiu |
| 2010/0320499 A1* | 12/2010 | Catalano ............ H05B 33/0803 257/99 |
| 2011/0090691 A1* | 4/2011 | Markle ................. F21K 9/00 362/249.02 |
| 2011/0121705 A1 | 5/2011 | Bancken et al. |
| 2012/0175643 A1* | 7/2012 | West .................... H01L 33/62 257/88 |
| 2012/0236531 A1 | 9/2012 | Lim et al. |
| 2012/0307501 A1 | 12/2012 | Tankala et al. |
| 2012/0313135 A1* | 12/2012 | Kashitani ............. H01L 33/62 257/99 |
| 2013/0215613 A1* | 8/2013 | Wu ..................... F21V 29/70 362/249.02 |

OTHER PUBLICATIONS

Fan, et al., "An Innovative Passive Cooling Method for High Performance Light-emitting Diodes", In Proceedings of 28th Annual IEEE Semiconductor Thermal Measurement and Management Symposium, Mar. 18, 2012, 6 pages.

* cited by examiner

ACTIVE ILLUMINATION SOURCE AND PCB COMPONENTS HAVING MOUNTINGS FOR REDUCED Z-HEIGHT AND IMPROVED THERMAL CONDUCTIVITY

BACKGROUND

An ongoing focus in the mobile device industry is to design equipment that is lighter and smaller. Another focus is to increase the resolution and size of integrated display screens. Accordingly, it is most desirable to reduce a device's thickness, as the width and height of the device will limit the size of the integrated display screen.

One of the constraints associated with reducing the thickness of a mobile device is the overall profile of the integrated PCB (printed circuit board) assembly and the other components that are mounted to the PCB. For instance, many PCB assemblies are configured with camera modules and active light illumination sources, such as LED (light emitting diode) illuminators, that have lenses that protrude away from the PCB.

LED illuminators are typically affixed to a mounting substrate that is separately mounted to the PCB with solder, an epoxy and/or another connector. The height dimension existing between the top surface of the PCB and the top of the LED illuminator (or other component mounted to the PCB) is referred to herein as the Z height dimension. The Z height dimension will often have a direct impact on the size and shape of the bezel on the computing device and the overall device thickness.

FIG. 1 illustrates a side view a typical PCB assembly 100 incorporating an LED illuminator 102 mounted to a PCB 140. The LED illuminator 102 includes a light emitting element 110 and a lens 120 affixed to a mounting substrate 130. The mounting substrate is separately mounted to the PCB 140 with one or more connector(s) 150. The overall Z height (103) of this PCB assembly 100, which extends between the top planar surface height 106 of the PCB 140 and the top height 104 of the LED lens 120, will typically be equal to or greater than about 2.35 mm. With a PCB substrate thickness of about 0.4 mm, the overall thickness of the PCB assembly will be equal to or greater than about 2.75 mm.

Some PCB components, such as LEDs generate a lot of heat that is often conducted through the PCB. This additional thermal load on the PCB often results in elevated heating of the device, displacement of sensitive components, and limits the operating power of the LED. Accordingly, there is often a need to improve the thermal properties of PCB assemblies to dissipate the heat as efficiently as possible.

In view of the foregoing and in an effort to reduce the overall thickness of mobile devices, it would be desirable to reduce the Z height dimension of the PCB assemblies that are incorporated into mobile devices. It is also desirable to improve the thermal conductivity and, thereby, the maximum power handling of illuminators incorporated into the PCB assemblies. Notwithstanding the foregoing, it will be appreciated that the subject matter claimed herein is not limited to any embodiments that solve any specific disadvantages or that operate only in the specific environments described above. Rather, this background is only provided to illustrate some exemplary technology areas where certain embodiments described herein may be practiced.

BRIEF SUMMARY

Disclosed embodiments include PCBs, PCB components and PCB assemblies having mounting configurations and structures for reducing Z height dimensions and, in some instances, improving thermal properties of the PCB components and assemblies.

In some embodiments, an active illumination device (also referred to herein as an "active illumination source") is provided for reducing Z height dimensions of PCB assemblies incorporating the active illumination device/source. The active illumination device/source includes a light emitting element and a lens mounted to a top surface of a mounting substrate. At least one electrical coupling is also attached to or at least exposed at the top surface of the mounting substrate for physically and/or electrically connecting the mounting substrate to a bottom surface of a printed circuit board when the electrical coupling is positioned between the bottom surface of the printed circuit board and the top surface of the mounting substrate.

In some embodiments, a camera module assembly is provided for reducing Z height dimensions of PCB assemblies incorporating the camera module. The camera module includes an active illumination source (or "active illumination device") having a light source (e.g., LED or other light emitting element) and a lens attached to a top surface of a mounting substrate, and electrical coupling elements for the active illumination source being exposed at the top surface of the mounting substrate. The camera module assembly also includes a camera sensor that is mounted on a top surface of the mounting substrate or to a PCB attached to the mounting substrate. In some instances, the camera module assembly also includes processing circuitry electrically coupled to one or more conductive elements passing through the body of the PCB, from the top surface of the printed circuit board to a bottom surface of the printed circuit board. In some embodiments, the top surface of the mounting substrate is also directly mounted to the bottom surface of the PCB with solder, wherein the electrical coupling elements for the active illumination source and the one or more conductive elements are in direct contact with the solder, such that the solder physically and electrically couples the active illumination source to the circuitry on the printed circuit board.

In some embodiments, a PCB is provided with a body interposed between a top surface and a bottom surface. The body of the PCB defines an aperture passing completely through the body. Processing circuitry is mounted to the top surface of the body. The PCB also includes an active illumination source comprising a light element (e.g., LED or other light emitting element) and a lens. The active illumination source is physically connected to the bottom surface of the PCB with one or more mounting elements interposed between the bottom surface of the PCB and the active illumination source. In some embodiments, the lens is positioned at least partially within the aperture in the PCB and at least a portion of the active illumination source is positioned outside of the PCB body, below the PCB bottom surface (i.e., extending away from bottom surface, on an opposing side of the bottom surface than the PCB body). In some embodiments, one or more conductive elements are also included, passing through the PCB body, electrically connecting the processing circuitry to the active illumination source.

By mounting the active illumination source (and, in some instances, the camera module) to the bottom surface of the PCB, it is possible to reduce the Z height of the PCB assembly, as compared to a same or similar PCB assembly having the active illumination source (and/or camera module) mounted to a top surface of the PCB.

In some embodiments, the lens of the active illumination source is in direct physical contact with the PCB body, at least partially within the aperture. In other embodiments, there is a space between the PCB body and the lens (with no physical contact between the lens and the PCB body) within the aperture. The aperture in some embodiments has a tapered or curved edge, at least along a top surface edge of the aperture along the top surface of the PCB body. In other embodiments, the top surface aperture edge is a perpendicular or squared edge.

In some embodiments, the PCB assembly and/or mounting substrate of the active illumination source/device is direct physical contact with a thermal interface having thermal properties that conduct heat away from the PCB assembly and/or active illumination source/device. In some embodiments, the thermal interface is a computing device bezel and/or a heat sink.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Disclosed and claimed embodiments include PCBs, PCB components and PCB assemblies having mounting configurations and structures for reducing Z height dimensions of the PCB assemblies and, in some instances, for improving thermal conductivity of the same. This is accomplished, in some instances, by providing LED devices, camera modules and other PCB components with mounting substrates having exposed elements for directly mounting the substrates to the bottom surface of a PCB, while concurrently positioning a portion of the LED device(s), camera modules or other PCB components in the hole(s) formed into the body of the PCB.

Figure 1:
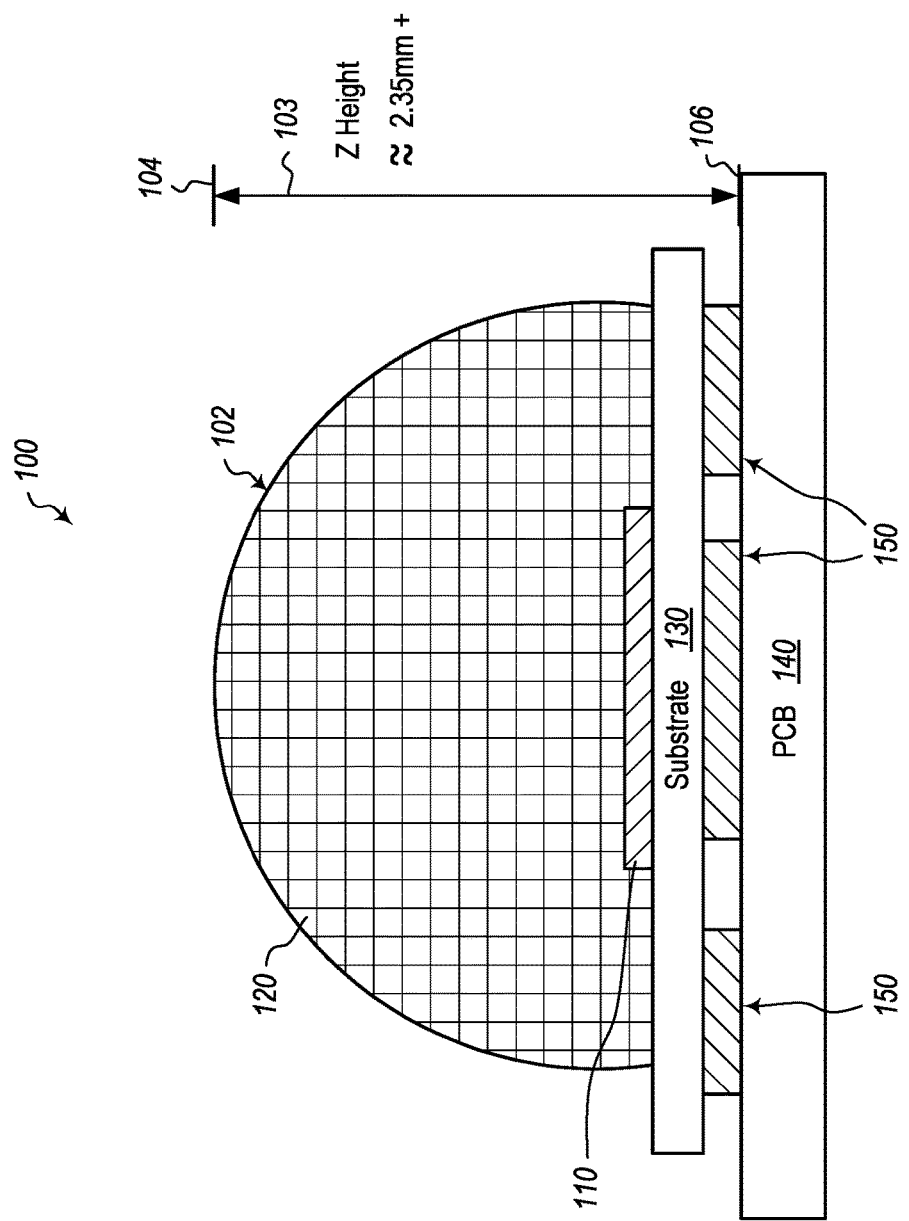
FIG. 1 illustrates an example of a prior art PCB assembly having an LED illuminator mounted to a top surface of a PCB.
Figure 2:
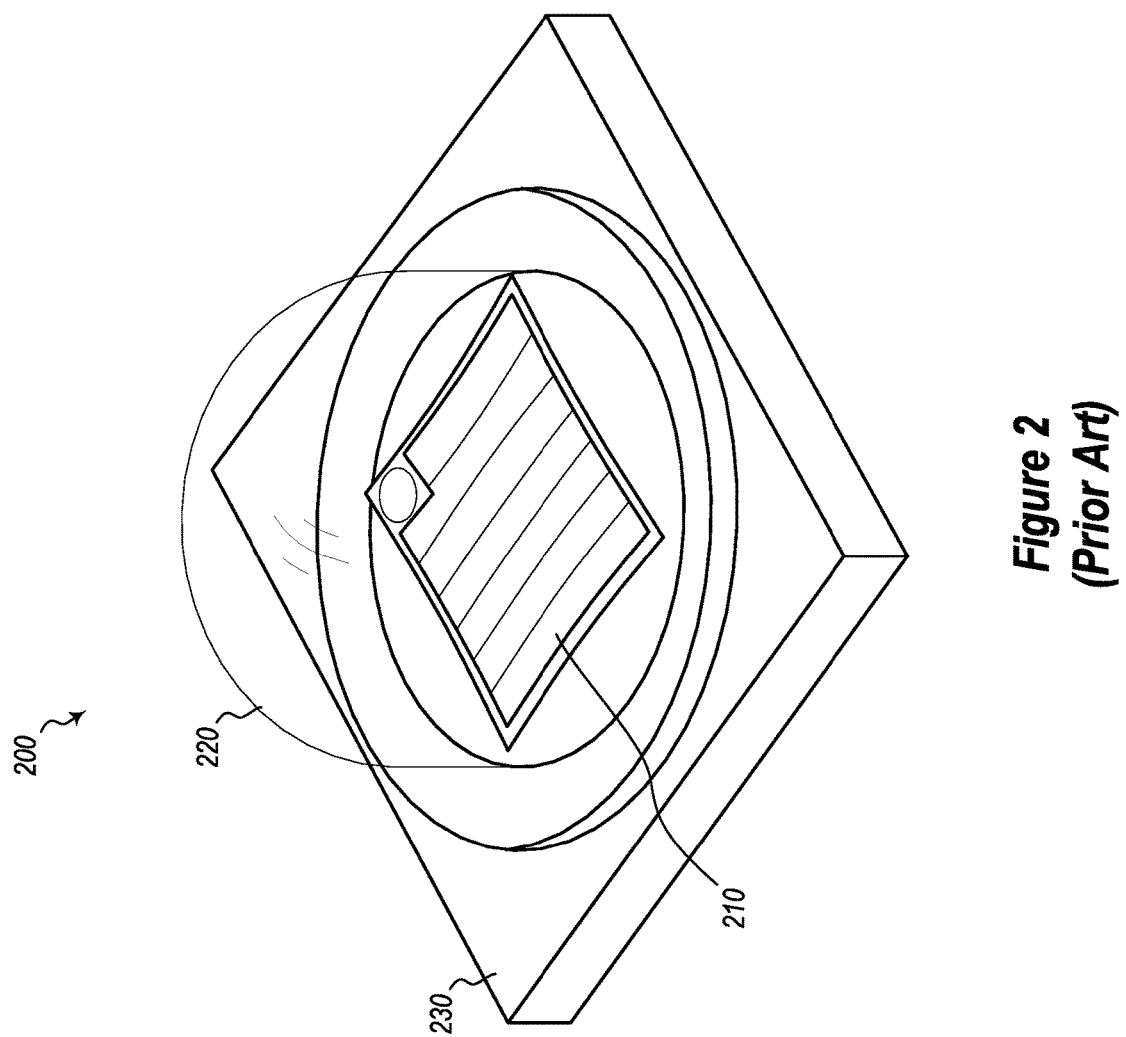
FIG. 2 illustrates an example of a prior art LED illuminator.

Attention will first be directed to FIGS. 1 and 2, which illustrate existing PCB assemblies and LED illuminators. In FIG. 1, discussed earlier, a typical prior art LED illuminator 100 is mounted to a top surface of a PCB. FIG. 2 illustrates another embodiment of a prior art LED illuminator 200 having a light emitting element 210 covered by a lens 220 and which is mounted to a substrate 230. In this configuration, connectors are positioned on the bottom of the substrate 230 for connecting the LED illuminator to circuitry on a PCB when the illuminator mounted to a top surface of a PCB. Notably, as previously mentioned, the overall Z height of a typical prior art PCB assembly, like this, having the LED illuminator (or other component) mounted to the top surface of the PCB will not be optimal, particularly in comparison to the disclosed embodiments that include an LED illuminator (or other component) mounted to a bottom surface of the PCB, with a portion of the illuminator (or other component) being positioned within a hole in the PCB.

Figure 3:
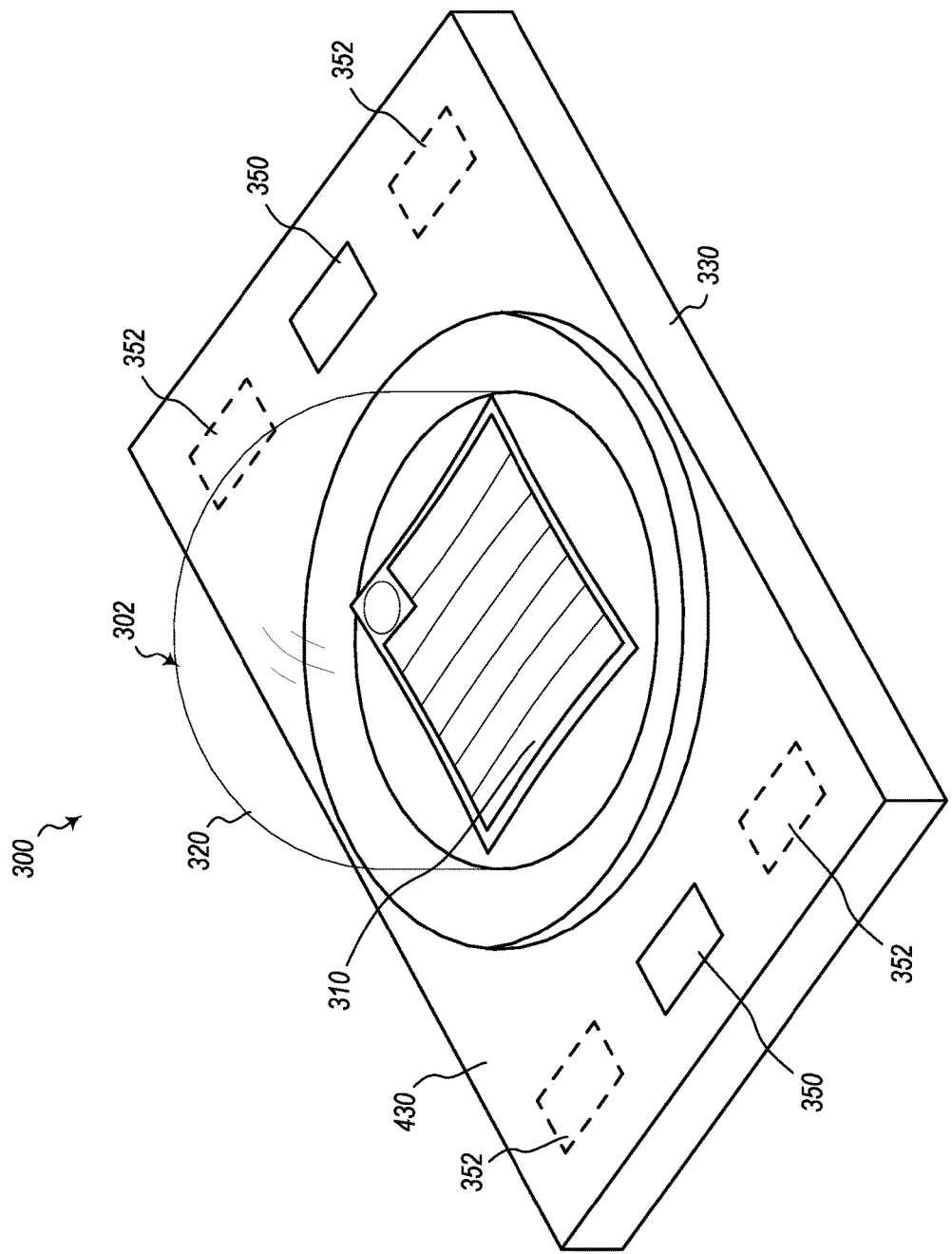
FIG. 3 illustrates an example of an active illumination device (also referred to herein as an "active illumination source") having a mounting substrate and elements exposed at a top surface of the mounting substrate for mounting the active illumination device/source to a bottom surface of a PCB.

Attention will now be directed to FIG. 3, which illustrates an example of an active illumination device 300 (also referred to herein as an "active illumination source") having a mounting substrate 330 and connecting elements 350, 352 exposed at a top surface of the mounting substrate for mounting the active illumination device 300 to a bottom surface of a PCB. As shown, the active illumination device 300 includes an LED or other illumination source 302 that includes an illumination element 310 and a lens 320.

As further illustrated, the mounting substrate 330 has sides that are extended, relative to the typical prior art illuminator substrate (see FIGS. 1 and 2), to accommodate the presence of the exposed connecting elements 350. These connecting elements 350 comprise electrical contacts which, in some embodiments, are electrically connected to the illumination element 310, for powering the illumination element 310 when power is passed through the connecting elements 350. Notably, the position and quantity of the connecting elements 350 can be modified to accommodate different use preferences. Some non-limiting examples of different positions and quantities of the connecting elements 350 are reflected by elements 352. Each of the connecting elements 350 and/or 352 can be aligned with the planar surface of the mounting substrate 330, recessed into and/or protruding out of the mounting substrate.

Figure 6:
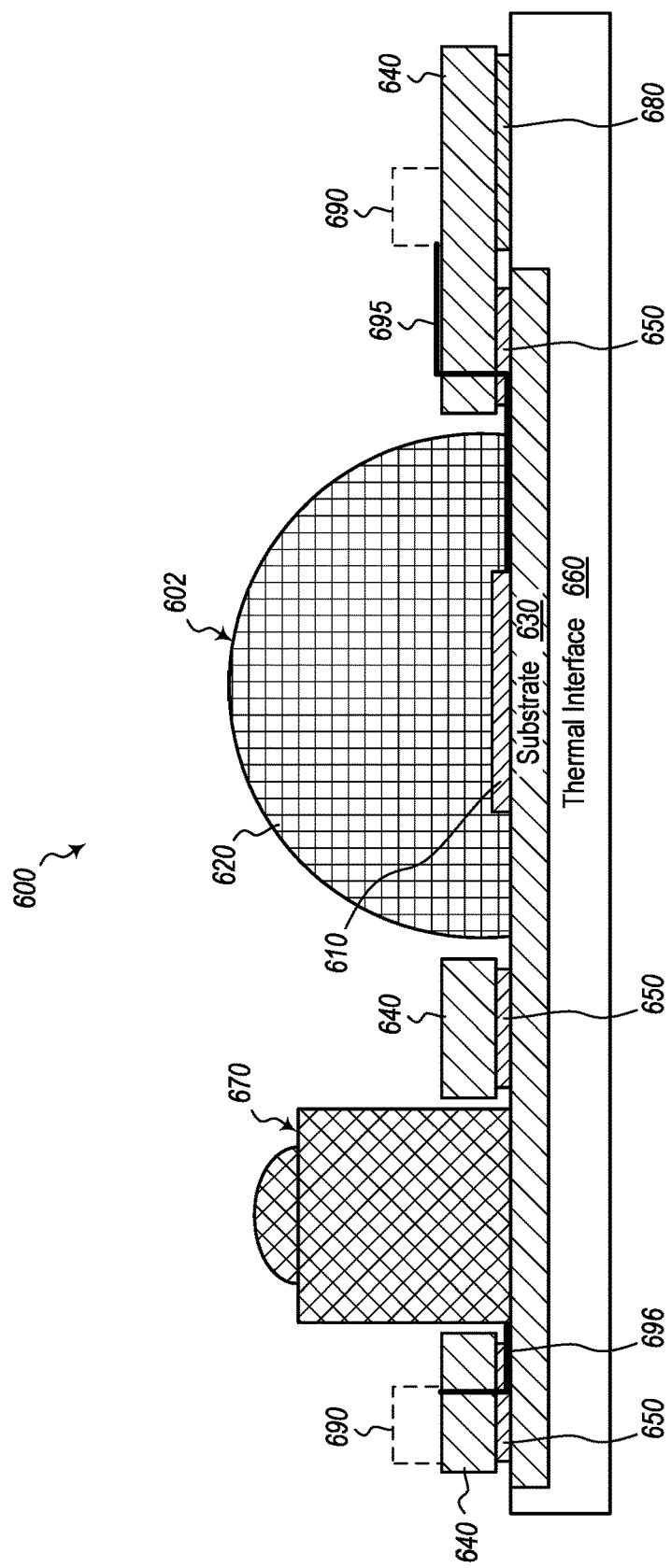
FIG. 6 illustrates an example of a PCB assembly that includes a PCB and the camera module of FIG. 5 mounted to a bottom surface of the PCB.

Soldering or other electrical connectors are used, in some instances, to physically and electrically mount/connect the active illumination device to a PCB. In particular, solder can be positioned directly between the connecting elements (350 and/or 352) and corresponding electrical contacts on the bottom surface of a PCB. When the solder/connectors are electrically conductive, this will create an electrical circuit between the illumination element and the circuitry on the PCB. This is shown in FIG. 4A and FIG. 6, for example.

Figure 4A:
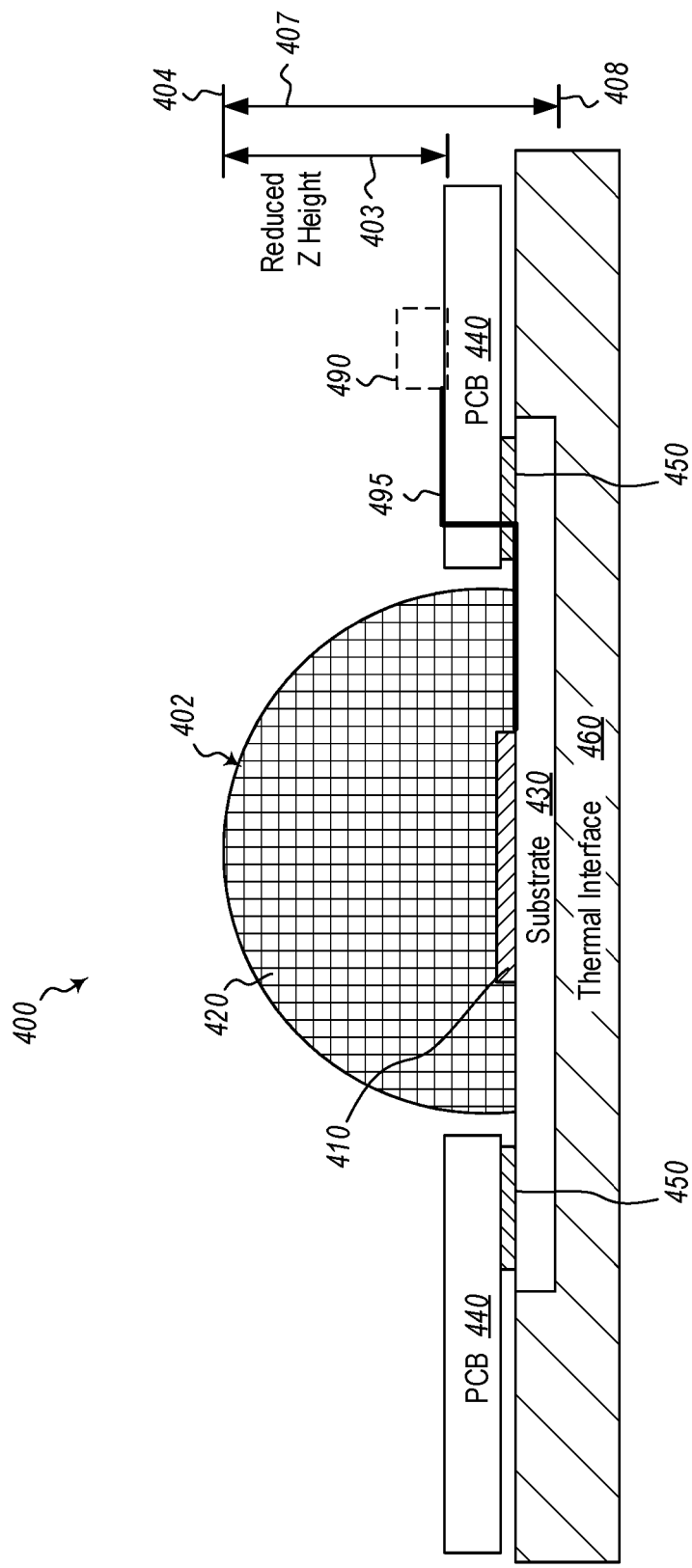
FIG. 4A illustrates an example of a PCB assembly having an active illumination device/source mounted to a bottom surface of a PCB.

In FIG. 4A, a PCB assembly 400 having an illumination device 402 mounted to a bottom surface of a PCB 440. The illumination device 402 can be an LED illuminator or other type of illumination device having a light emitting element 410 and one or more lens 420 affixed/mounted to a substrate, such as mounting substrate 430.

The PCB 440 includes one or more PCB components/circuitry 490 (e.g., one or more processors, transistors, capacitors, resistors, power sources, and/or other electronic components) that are electrically connected to the illumination device 402 (particularly the light emitting element 410) through one or more electrical coupling elements 495 and/or the connector(s) 450. The connector(s) 450 are preferably conductive and are positioned in direct physical contact with the electrical connecting elements 350 and/or 352 to complete an electrical circuit between the PCB circuitry and the light emitting element.

As shown, this configuration of the PCB assembly 400, in which the illumination device 402 is mounted to the bottom of the PCB 440, enables the PCB assembly 400 to have a reduced Z height dimension 403, which extends between the top of the lens 420 or the top of another similarly mounted PCB component, as reflected by indicator 404, and the top of the planar PCB surface, as reflected by indicator 406.

In some instances, such as for high power IR LED modules, the reduced Z height dimension 403 is less than or equal to about 1.55 mm. In some instances, the overall PCB assembly thickness 407, which extends between the top of the lens 420 or the top of another similarly mounted PCB component, reflected by height 404, and the bottom surface of the mounting substrate, as reflected by indicator 408, is less than or equal to about 2.35 mm. It will be appreciated that this represents a significant improvement over the prior art systems that have a Z height of about 2.35 mm or greater and a PCB assembly thickness of about 2.75 or greater.

In related embodiments the Z height dimension 403 is greater than 1.55 mm, but still between 1.55 mm and 2.35 mm, and the overall PCB assembly thickness 407 is a length greater than 2.35 mm, but still between 2.35 mm and 2.75 mm.

In yet other embodiments, the total Z height dimension 403 is less than 2.0 mm and/or the total PCB assembly thickness 407 is less than 2.0 mm. This is possible, for example, by using super thin PCBs (e.g., less than 0.4 mm) and by using thinner IR LEDs (e.g., less than 1.5 mm).

In some instances, as shown, the mounting substrate 430 is in direct contact with a thermal interface 460. The thermal interface 460 comprises a thermally conductive heat sink having special thermal properties for conducting heat away from the mounting substrate 430. In some instances, the thermal interface is a bezel or other mounting hardware of a computing device or display screen.

In some instances, the mounting substrate 430 has a planar bottom surface that is in planar contact with a corresponding planar surface of the thermal interface 460. In some instances, as shown, the thermal interface 460 also surrounds and/or is in direct contact with one or more side surfaces of the mounting substrate 430, in addition to being in contact with a bottom surface of the mounting substrate 430.

To further facilitate thermal conduction of heat away from the PCB and the illumination device 400, via the thermal interface 460, fill material can be positioned directly between the PCB 440 and the thermal interface, such as shown by fill material 680 in FIG. 6. The fill material 680 is a thermally conductive interface material, such as a thermal putty, graphite, or other thermally conductive material. While the fill material 680 is only shown to cover a portion of the gap between the PCB 640 and thermal interface 660, it will be appreciated that the fill material 680 can fill any/all gap portions between the PCB 640 and the thermal interface 660, such that no open space exists between the PCB 640 and the thermal interface 660.

Figure 4B:
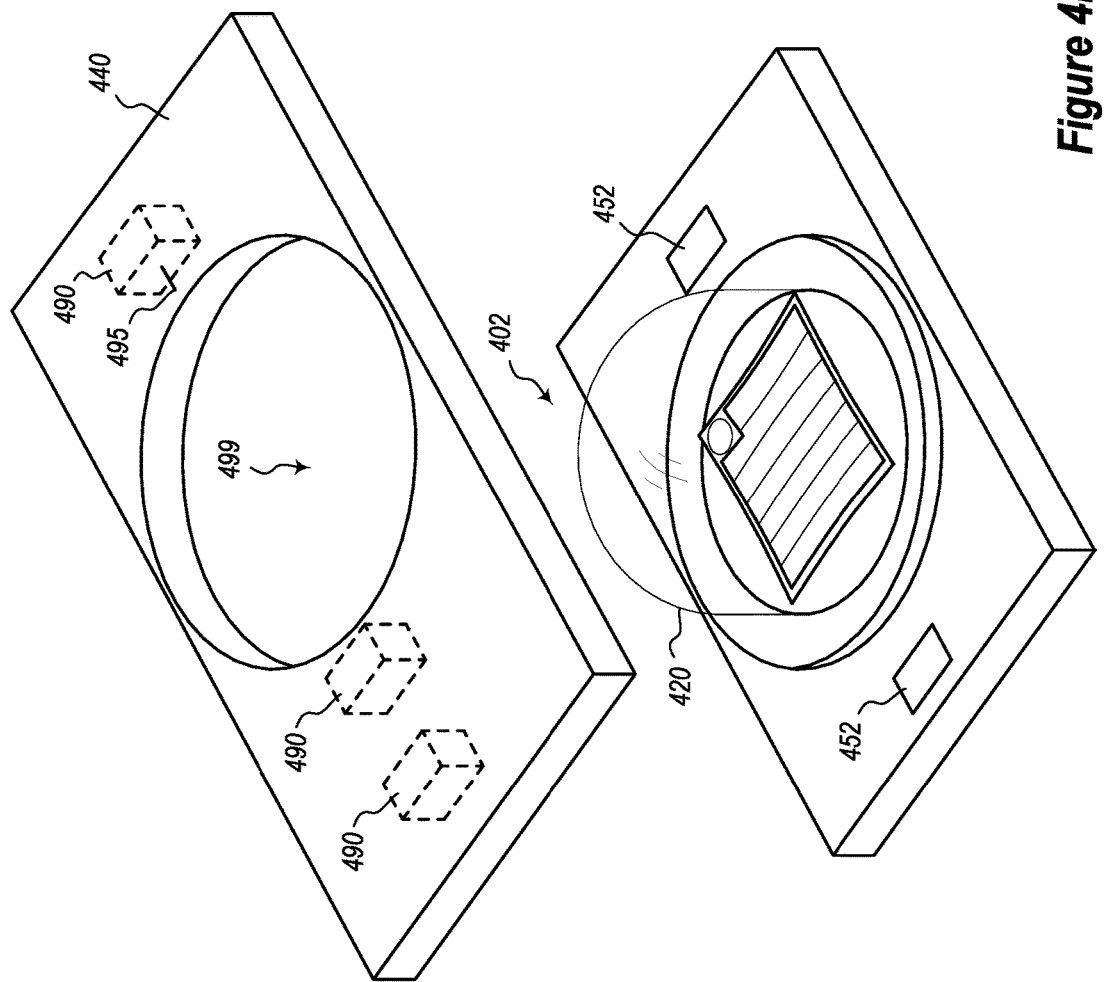
FIG. 4B illustrates an example of a PCB and an active illumination device/source which, when mounted together, form a PCB assembly, with an aperture/hole in the PCB that is sized to receive at least a portion of the active illumination device/source, such as the lens of the active illumination device/source.

Attention will now be directed to FIG. 4B, which illustrates an example of a PCB 440 (or, in some instances, only a small portion or limited section of a PCB). The PCB 440 is positioned above an active illumination device 402. When mounted together, the PCB 440 and the active illumination device 402 form a PCB assembly, such as the PCB assembly 400 of FIG. 4A. As shown, a hole or aperture 499 is formed in the PCB, which is sized to receive at least a portion of the active illumination device 402, specifically the lens 420, concurrently when the active illumination device 402 is mounted to the bottom surface of the PCB 440.

As shown, the mounting substrate 430 (FIG. 4A) of the active illumination device 402 includes also exposed electrical contacts 452 that are electrically connected (not visibly shown in FIG. 4B) with the light illuminating element of the active illumination device 402. These electrical contacts 452 form connecting points/surfaces for electrically soldering or otherwise connecting the active illumination device 402 to the PCB 440. When a conductive connector, such as copper solder or a conductive epoxy is used as the mounting connector (e.g., connector 450 of FIG. 4A), the active illumination device 402 is electrically coupled to the circuitry 490 on the PCB 440 via the connector(s) 450 and/or the one or more electrical connectors 495 formed on the PCB 440 and/or that pass through the PCB 440.

In some instances, the lens 420 is in direct contact with the PCB 440 when the active illumination device is concurrently positioned inside of the PCB aperture 499. In other instances, there is a gap existing all the way around the circumference of the lens 420 and the PCB aperture 499 to accommodate different thermal and/or optical preferences.

Figure 5:
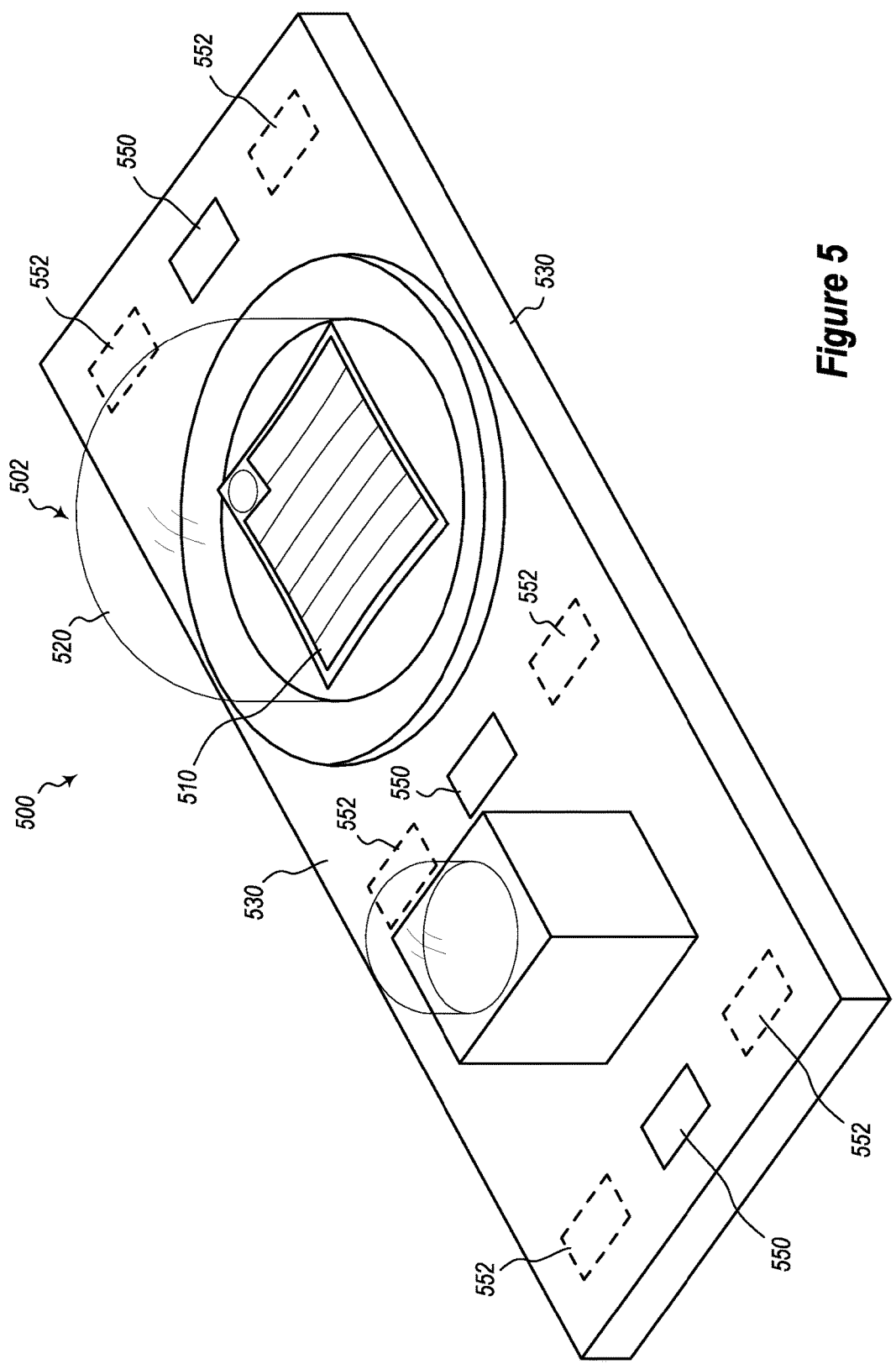
FIG. 5 illustrates an example of camera module having a mounting substrate and elements exposed at a top surface of the mounting substrate for mounting the camera module to a bottom surface of a PCB.

FIG. 5 illustrates an example of camera module 500 having a mounting substrate 530 and electrical connecting elements 550 exposed at a top surface of the mounting substrate 530 for mounting the camera module 500 to a bottom surface of a PCB. As mentioned previously, the electrical connecting elements 550 can be positioned at different locations on the substrate and comprise any quantity of elements (e.g., two or more), as reflected by the non-limiting examples of electrical connecting elements 552.

The camera module 500 also includes an LED illuminator or other type of light illuminating device 502 having a lens 520 and a light emitting element 510 mounted to the mounting substrate 530. A camera component 570, which may comprise any PCB mounting compatible camera or sensor, with or without a lens, is also mounted to the top surface of the mounting substrate 530. The camera component 570 and the light emitting element 510 are electrically connected to the electrical connecting elements 550 and/or 552, with surface contacts (not shown) or internal contacts positioned through at least a body portion and/or bottom surface of the mounting substrate (not shown).

In alternative configurations, the camera component 570 is not mounted to the mounting substrate 530 but, instead, is mounted to the top surface of the PCB. When the camera component 570 is mounted to the mounting substrate 530, the corresponding PCB assembly (see PCB assembly 600) will be configured with a hole formed through the PCB, similar to the aperture 499 described in FIG. 4B, but with a shape and size that corresponds to the footprint and size of the camera component 570.

In other alternative embodiments, one or more supplemental elements/components are mounted to the mounting substrate 530, in addition to or in place of the camera component. As mentioned above, when such components are mounted on the mounting substrate, the corresponding PCB assembly will include a PCB having one or more holes/apertures that are sized and shaped to accommodate the one or more supplemental elements/components. Corresponding electrical contacts in the mounting substrate are also connected to the supplemental elements/components, in such embodiments, to complete an electrical circuit with the PCB circuitry on the top surface of the PCB, concurrent to the mounting substrate being mounted to the bottom surface of the PCB, with one or more conductive connectors electrically connected to the PCB circuitry and the electrical contacts.

FIG. 6 illustrates an example of a PCB assembly 600 that includes a PCB 640 and a camera module, similar to the camera module 500 of FIG. 5, having an LED illuminator or other light illuminating device 602, and a camera component 670 mounted to a top surface of a mounting substrate 630. As shown, the LED illuminator 602 includes a light emitting element 610 and a lens 620 mounted to the mounting substrate 630. To reduce the overall Z height, as described above, the top surface of the mounting substrate 630 is physically and electrically mounted to the bottom surface of the PCB 640. This is accomplished, in some instances, by using a conductive solder, conductive epoxy and/or wiring.

Other electrical coupling elements 695 and/or 696 may also be provided to complete an electrical circuit between the light emitting element 610 and/or the camera component 670 with PCB circuitry 690 (one or more processors, transistors, resistors, capacitors, power sources and/or other electronic components) mounted to the top surface of the PCB 640.

The connector(s) 650 are preferably conductive and are positioned in direct physical contact with the electrical connecting elements 550 and/or 552 and/or connectors 695 and/or 696 to complete the one or more electrical circuits between the PCB assembly circuitry (e.g., camera component 670, PCB circuitry 690, light emitting element 610 and/or other PCB components).

In some instances, the mounting substrate 630 is connected to and/or positioned in direct planar contact with a thermal interface 660, such as a heat sink, bezel or other hardware of a computing device. To further facilitate thermal conductivity between the PCB and/or the mounting substrate with the thermal interface 660, a conductive fill material 680 (which may comprise any conductive plastic, metal or composite) may be positioned between any and/or all gaps between the PCB 640 and the thermal interface 660.

In some embodiments, as previously discussed, the lens 620 of the active illumination source 602 and/or any portion of one or more other components mounted to the top surface of the mounting substrate 630 may be positioned inside of one or more holes/apertures formed in a PCB when the mounting substrate 630 is concurrently mounted to the bottom surface of the PCB. In some instances, the lens (e.g. 620 or other component on the mounting substrate 630) is positioned in direct physical contact with the PCB body, while being positioned at least partially within the hole/aperture of the PCB body. In other embodiments, there is a gap/space between the PCB body and the lens or other mounting substrate component, with no physical contact occurring between the lens/component and the PCB body while the lens/component is positioned within the PCB hole/aperture.

It will be appreciated that the shape of the aperture, specifically the top edge of the aperture can also vary, to accommodate different needs and preferences, such as to improve or modify the thermal and/or optical properties of the illumination device(s) and other component(s) positioned in the PCB hole(s)/aperture(s). To illustrate some non-limiting examples of different edge configurations, attention is now directed to FIGS. 7 and 8.

Figure 7:
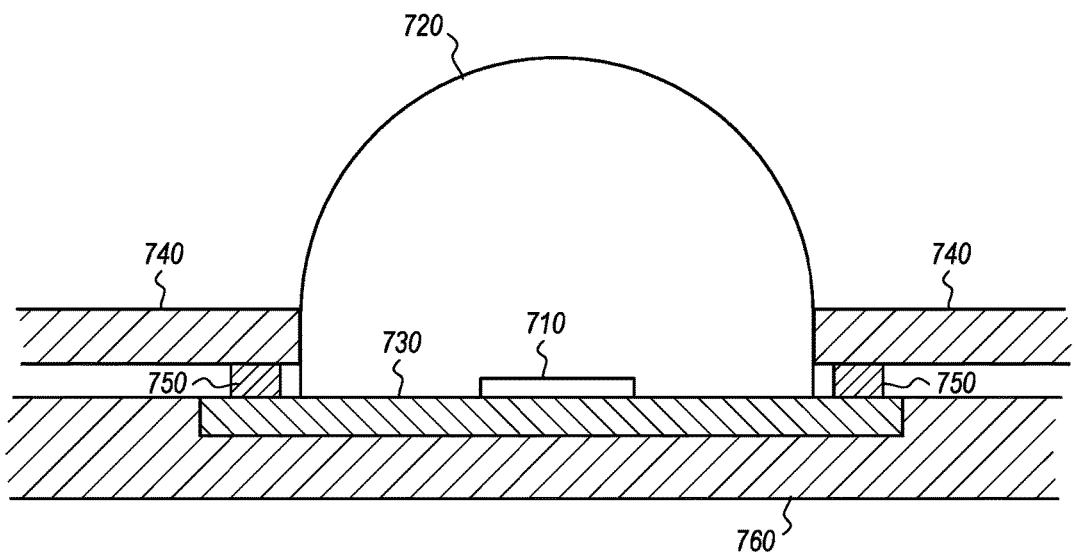
FIG. 7 illustrates a cutaway side view of a PCB assembly in which the lens of an active illumination device/source is in direct contact with the PCB body within an aperture/hole formed in the PCB body.

FIG. 7 illustrates a cutaway side view of a PCB assembly in which a lens 720 and light emitting element 710 of an active illumination device are mounted to a mounting substrate 730. The mounting substrate 730 is physically/electrically connected to the bottom surface of a PCB 740 with one or more connectors 750, similar to previous embodiments. The mounting substrate 730 is also optionally connected to a thermal interface 760, similar to previous embodiments.

Notably, the sides of the PCB 740, along the inside surface of the hole in the PCB 740, are in direct contact with the lens 720. The lens 720 can also, optionally, be replaced with another component on the mounting substrate 730, as described above. The edges of the hole, adjacent the lens 720 are illustrated as having a perpendicular or rectilinear shape, forming one or more edges that extend between the top surface and the bottom surface of the PCB 740 and that are in direct contact with the lens 720. In alternative embodiments, a space/gap is formed between the PCB 740 and the lens 720, such as illustrated in the embodiments of FIGS. 4A and 6.

Figure 8:
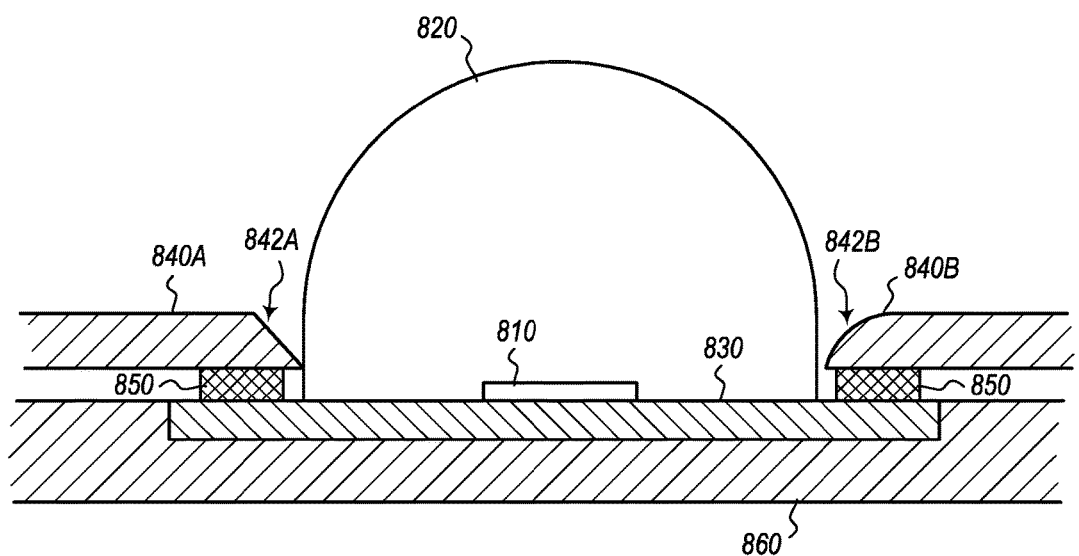
FIG. 8 illustrates a cutaway side view of a PCB assembly in which the lens of an active illumination device/source is positioned within the aperture/hole formed in a PCB body and in which a top surface edge of the aperture is tapered.

Attention is now directed to FIG. 8, which illustrates a cutaway side view of a PCB assembly in which a lens 820 and light emitting element 810 of an active illumination device are mounted to a mounting substrate 830. The mounting substrate 830 is physically/electrically connected with one or more connectors 850 to the bottom surface of a PCB 840 (identified in FIG. 8 as both a first edge configuration PCB 840A and a second edge configuration PCB 840B). The mounting substrate 830 is also optionally connected to a thermal interface 860, similar to other embodiments described herein.

In the first edge configuration PCB 840A, the edge of hole/aperture 842A is tapered with an angled edge. Alternatively, in the second edge configuration PCB 840B, the edge of hole/aperture 842B is tapered with a convexly curved edge. In yet other embodiments, the hole/aperture is tapered with a concaved curved edge or a stepped and/or an irregularly tapered edge.

In some embodiments, as previously described, the hole/aperture edge 842A (or edge 842B) is in direct contact with the lens 820 or other component positioned inside of the hole. In other embodiments, as previously described, a gap/space is formed between the hole/aperture edge 842B (or edge 842A) and the lens 820 or other component positioned inside of the hole.

As will be appreciated from the foregoing, the disclosed embodiments include active illumination devices configured for reducing Z height dimensions of PCB assemblies that incorporate the active illumination devices. In some such embodiments, an active illumination device includes a light emitting element and a lens mounted to a top surface of a mounting substrate and at least one electrical coupling attached to or at least exposed at the top surface of the mounting substrate for physically and/or electrically connecting the mounting substrate to a bottom surface of a printed circuit board when the electrical coupling is positioned between the bottom surface of the printed circuit board and the top surface of the mounting substrate.

In other embodiments, a camera module assembly is provided for reducing Z height dimensions of PCB assemblies incorporating the camera module. The camera module includes an active illumination source having a light source (e.g., LED or other light emitting element) and a lens attached to a top surface of a mounting substrate, and electrical coupling elements for the active illumination source being exposed at the top surface of the mounting substrate. The camera module assembly also includes a camera sensor that is mounted on a top surface of the mounting substrate or to a PCB attached to the mounting substrate. In some instances, the camera module assembly also includes processing circuitry electrically coupled to one or more conductive elements passing through the body of the PCB, from the top surface of the printed circuit board to a bottom surface of the printed circuit board. In some such embodiments, the top surface of the mounting substrate is also directly mounted to the bottom surface of the PCB with solder, wherein the electrical coupling elements for the active illumination source and the one or more conductive elements are in direct contact with the solder, such that the solder physically and electrically couples the active illumination source to the circuitry on the printed circuit board.

In other embodiments, a PCB is provided with a body interposed between a top PCB surface and a bottom PCB surface. The body of the PCB defines an aperture passing completely through the body. Processing circuitry is mounted to the top surface of the body. The PCB also includes an active illumination source comprising a light element (e.g., LED or other light emitting element) and a lens. The active illumination source is physically connected to the bottom surface of the PCB with one or more mounting elements interposed between the bottom surface of the PCB and the active illumination source. In some embodiments, the lens is positioned at least partially within the aperture in the PCB and at least a portion of the active illumination source is positioned outside of the PCB body, below the PCB bottom surface (i.e., extending away from bottom surface, on an opposing side of the bottom surface than the PCB body). In some such embodiments, one or more conductive elements are also included, passing through the PCB body, electrically connecting the processing circuitry to the active illumination source.

Utilizing the embodiments described herein, with an active illumination source being mounted to the bottom surface of a PCB, it is possible for PCB assemblies to achieve a Z height dimension that is reduced, relative to prior art PCB assemblies having active illumination sources mounted to a top surface of the PCBs. It is also possible, utilizing the embodiments described herein, to improve thermal dispersion properties of PCB assemblies mounted in computing devices.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A printed circuit board assembly comprising:
   a printed circuit board (PCB);
   a light emitting element mounted to a top surface of a mounting substrate;
   a lens mounted to the top surface of the mounting substrate and covering at least a portion of the light emitting element;
   at least one electrical coupling exposed at or attached to the top surface of the mounting substrate physically connecting the top surface of the mounting substrate to a bottom surface of the PCB; wherein the at least one electrical coupling electrically connects the light emitting element to circuitry mounted to a top surface of the PCB; and
   a thermal interface in direct contact with a bottom surface of the mounting substrate and one or more sides of the mounting substrate.

2. The printed circuit board assembly of claim 1, wherein the light emitting element is mounted to the mounting substrate with a conductive adhesive.

3. The printed circuit board assembly of claim 1, wherein at least a portion of the light emitting element is positioned in a space between the bottom of the printed circuit board and the top surface of the mounting substrate.

4. The printed circuit board assembly of claim 3, wherein the light emitting element is mounted to the mounting substrate with an adhesive and at least a portion of the adhesive is positioned between a planar surface of the bottom of the printed circuit board and the top surface of the mounting substrate.

5. The printed circuit board assembly of claim 1, wherein the lens is at least partially positioned within a hole formed in the printed circuit board.

6. The printed circuit board assembly of claim 5, wherein the lens is positioned against the printed circuit board.

7. The printed circuit board assembly of claim 5, wherein the hole has a beveled or tapered edge that causes a diameter of the hole to be greater in size along a top surface of the printed circuit board than a diameter of the hole along a bottom surface of the printed circuit board.

8. The printed circuit board assembly of claim 1, wherein the thermal interface comprises a heatsink that includes a bezel of a computing device.

9. The printed circuit board assembly of claim 1, wherein the light emitting element is configured to emit visible light.

10. The printed circuit board assembly of claim 1, wherein the light emitting element is configured to emit infrared light.

11. The printed circuit board assembly of claim 1, wherein the active illumination device comprises a light emitting diode ("LED"), with the light emitting element comprising an LED chip, with the lens comprising an LED lens and the mounting substrate comprising an LED mounting substrate, the LED lens being positioned above a top surface of the PCB.

12. A printed circuit board assembly comprising:
a printed circuit board (PCB) including a body interposed between a top surface of the PCB and a bottom surface of the PCB, the body defining an aperture passing completely through the body;
processing circuitry mounted to the top surface;
a mounting substrate mounted to the bottom surface of the PCB with one or more mounting elements interposed between the bottom surface and the mounting substrate, the mounting substrate having mounted thereon:
an active illumination source that includes a light element and a lens, the active illumination source being physically connected to the mounting substrate, wherein the lens is positioned at least partially within the aperture such that at least a portion of the active illumination source extends from below the bottom surface of the PCB to above the top surface of the PCB; and
a camera component physically connected to the mounting substrate; and
one or more conductive elements passing through the body, electrically connecting the processing circuitry to the active illumination source and the camera component.

13. The printed circuit board assembly of claim 12, wherein the lens is in direct contact with a bottom aperture edge circumscribing the aperture at the bottom surface.

14. The printed circuit board assembly of claim 12, wherein the aperture is bounded by a top aperture edge and a bottom aperture edge, the top aperture edge circumscribing the aperture at the top surface and the bottom aperture edge circumscribing the aperture at the bottom surface, the top aperture edge having a greater diameter than the bottom aperture edge.

* * * * *